ized under 35
United States Patent
Rancoule

(12) United States Patent
Rancoule

(10) Patent No.: US 8,152,920 B2
(45) Date of Patent: Apr. 10, 2012

(54) CRUCIBLE FOR THE CRYSTALLIZATION OF SILICON

(75) Inventor: Gilbert Rancoule, Marcq-en-Baroeul (FR)

(73) Assignee: Vesuvius Crucible Company, Wilmington, DE (US)

( * ) Notice: Subject to any disclaimer, the term of this patent is extended or adjusted under 35 U.S.C. 154(b) by 1127 days.

(21) Appl. No.: 11/994,151

(22) PCT Filed: Jun. 30, 2006

(86) PCT No.: PCT/EP2006/006347
§ 371 (c)(1),
(2), (4) Date: Dec. 28, 2007

(87) PCT Pub. No.: WO2007/003354
PCT Pub. Date: Jan. 11, 2007

(65) Prior Publication Data
US 2008/0196656 A1 Aug. 21, 2008

(30) Foreign Application Priority Data
Jul. 1, 2005 (EP) .................................... 05076520

(51) Int. Cl.
*C30B 15/10* (2006.01)

(52) U.S. Cl. .......................... 117/200; 117/208; 117/900
(58) Field of Classification Search .................. 117/900, 117/200, 208
See application file for complete search history.

(56) References Cited

U.S. PATENT DOCUMENTS 4,741,925 A 5/1988 Chaudhuri et al.
5,431,869 A 7/1995 Kumar et al.

FOREIGN PATENT DOCUMENTS

WO WO 2004/053207 A1 6/2004

*Primary Examiner* — Bob M Kunemund
(74) *Attorney, Agent, or Firm* — Thomas Clinton; Donald M. Satina

(57) ABSTRACT

A crucible and method for the crystallization of silicon utilize release coatings. The crucible is used in the handling of molten materials that are solidified in the crucible and then removed as ingots. The crucible does not require the preparation of a very thick coating at the end user facilities, is faster and cheaper to produce, presents an improved release effect and allows the production of silicon ingot without cracks. The crucible includes a base body, a substrate layer containing silicon nitride, an intermediate layer containing silica, and a surface layer containing silicon nitride, silicon dioxide and silicon.

11 Claims, 1 Drawing Sheet

CRUCIBLE FOR THE CRYSTALLIZATION OF SILICON

BACKGROUND OF THE INVENTION

1. Field of the Invention

The invention relates to a crucible for the crystallization of silicon and to the preparation and application of release coatings for crucibles used in the handling of molten materials that are solidified in the crucible and then removed as ingots, and more particularly to release coatings for crucibles used in the solidification of polycrystalline silicon.

2. Description of the Related Art

Crucibles of silica (either of fused-silica or of quartz) are typically used in solidification of polycrystalline silicon. Silica is chosen primarily for high-purity and availability. There are problems in using silica, however, as a crucible for the production of silicon by this method.

Silicon in its molten state will react with the silica crucible that is in contact with it. Molten silicon reacts with silica to form silicon monoxide and oxygen. Oxygen will contaminate the silicon. Silicon monoxide is volatile, and will react with the graphite components inside the furnace. Silicon monoxide reacts with graphite to form silicon carbide and carbon monoxide. The carbon monoxide will then react with the molten silicon, forming additional volatile silicon monoxide and carbon. Carbon will contaminate the silicon. Silicon can also react with the various impurities contained in the silica crucible (iron, boron, aluminum, . . . ).

The reaction between silica and silicon promotes adhesion of the silicon to the crucible. This adhesion, combined with a difference in coefficients of thermal expansion between the two materials, creates stress in the silicon ingot, causing it to crack on cooling. It is known in the art that a release coating applied to the inside of the crucible in the area of contact with the ingot can prevent the reaction between silicon and silica that leads to ingot contamination and cracking. To be effective, the release coating must be thick enough to prevent the silicon from reacting with the silica crucible, and must not adversely contaminate the silicon either by itself or from contaminants within it.

A variety of materials and techniques are described in the literature, which attempt to solve the problem of reaction and adhesion of the crucible in contact with molten material. For example U.S. Pat. No. 5,431,869 describes a multi-component release agent of silicon nitride and calcium chloride for silicon processing using a graphite crucible. This document teaches a crucible for the crystallization of silicon in which the inner crucible wall is coated with a silicon nitride powder to form a first layer having a thickness from 150 to 300 micron. This document does not teach the formation of other layers to produce the crucible as defined in present claim 1.

U.S. Pat. No. 4,741,925 describes a silicon nitride coating for crucibles applied by chemical vapor deposition at 1250° C. while WO-A1-2004053207 discloses a silicon nitride coating applied by plasma spraying. U.S. Pat. No. 3,746,569 discloses the pyrolysis formation of a silicon nitride coating on the walls of a quartz tube. U.S. Pat. No. 4,218,418 describes a technique of forming a glass layer inside a silica crucible by rapid heating to prevent cracking of silicon during melt-processing. U.S. Pat. No. 3,660,075 discloses a coating of niobium carbide or yttrium oxide on a graphite crucible for melting fissile materials. The niobium carbide is applied by chemical vapor deposition, while the yttrium oxide is applied as a colloidal suspension in an aqueous inorganic solution.

Prior art references include specific references to powdered mold release agents for application to crucibles in the directional solidification of silicon. In addition, the use of chemical vapor deposition, solvent evaporation, high-temperature flame treatment, and other expensive and complex means are mentioned for application of crucible coatings. References are made to specific binders and solvents. References are made to mixing, spraying, or brushing for slurries of powdered coatings.

This silicon nitride release coating itself can lead to problems. The thickness of the silicon nitride coating necessary to prevent the silicon from reacting with the silica crucible is quite important (about 300 μm) making thereby the coating operation expensive and time consuming. Further, this silicon nitride coating is mechanically weak and can peel or flake off during or even before use. It is therefore recommended to apply this coating at the very last moment before use, i.e., at the end user facilities, leaving thereby the burden of applying this thick coating to the end user.

In the co-pending International application WO-A1-2005106084, the applicant has suggested to use a crucible for the crystallization of silicon comprising a base body comprising a bottom surface and side walls defining an inner volume; an intermediate layer comprising 50 to 100 wt. % of silica at the surface of the side walls facing the inner volume; and a surface layer comprising 50 to 100 wt. % of silicon nitride, up to 50 wt. % of silicon dioxide and up to 20 wt. % of silicon on the top of the intermediate layer.

Although this crucible represents already a significant step forward with respect to the prior art, there remains some room for improvement. In particular, if during the crystallization of the silicon ingot, for any reason, the silicon ingot adheres to the surface layer, cracks will be generated at the surface of and will spread through the ingot during cooling down.

The co-pending International application WO-P01-2005106084 suggests to overcome this problem by limiting the adhesion of the intermediate layer to the base body and suggests, to this end, to act on the porosity of the intermediate layer. The present invention has for its objective to propose an alternative solution achieving this result.

BRIEF SUMMARY OF THE INVENTION

It has now been found that this objective can be reached with a crucible for the crystallization of silicon comprising a) a base body comprising a bottom surface and side walls defining an inner volume; b) a substrate layer comprising 80 to 100 wt. % of silicon nitride at the surface of the side walls facing the inner volume; c) an intermediate layer comprising 50 to 100 wt. % of silica on the top of the substrate layer; and d) a surface layer comprising 50 to 100 wt. % silicon nitride, up to 50 wt. % of silicon dioxide and up to 20 wt. % of silicon on the top of the intermediate layer.

Indeed, the substrate layer comprising 80 to 100 wt. % of silicon nitride is easy to apply at the surface of the side walls and provides an excellent release effect so that even if the silicon ingot adheres to the surface layer, cracks do not appear during cooling down and the ingot can be demolded very easily without damaging the ingot or crucible base body. Such a substrate layer is not necessary if the base body can already permit to achieve a release effect of the same level.

The intermediate layer comprising 50 to 100 wt. % of silica on the top of the substrate layer is extremely resistant and easy to manufacture. Surprisingly, there is no problem of peeling or flaking off with this intermediate layer, so that it can be prepared before reaching the end user facilities and the end user only needs to provide a thin surface layer which is faster and cheaper to coat. Moreover, it has been surprisingly discovered that this intermediate layer tremendously increases the adhesion of the surface layer. Even more surprisingly, the presence of the substrate layer does not lead to a reduction of the cohesion and strength of the overall coating.

According to an advantageous embodiment of the invention, the adhesion of the intermediate layer to the substrate layer is voluntarily limited so that the adhesion of the intermediate layer to the substrate layer is lower than the adhesion of the surface layer to a silicon ingot. The skilled person will easily identify the appropriate proportion of $Si_3N_4$ (between 80 and 100 wt. %) required to obtain the best effect.

Advantageously, the substrate layer has a thickness of 20 to 300 μm and more advantageously of 50 to 150 μm (that is the preferred thickness to achieve an efficient delamination between the base body and the coating).

The substrate layer can comprise a binder (organic, non-organic or organo-metallic) in an amount of 1 to 20 wt. %. Preferably an organic binder such as an organic resin like polyethylene glycol, polyvinyl alcohol, polycarbonate, epoxy, carboxymethylcellulose is used in an amount of 1 to 5 wt. %.

Another advantage of this coating is that it can be applied on various crucible materials so that the end user which receives a crucible with a silica containing intermediate layer does not need to develop particular and different procedures to coat various materials. The substrate layer can be applied on quartz, fused silica, SiAlON, silicon carbide, alumina or even graphite crucibles.

Advantageously, the substrate layer has a thickness of 20 to 300 μm (that is the preferred thickness to achieve an efficient delamination between the base body and the coating).

Advantageously, the intermediate layer has a thickness of 50 to 500 μm, preferably of 200 to 500 μm, so as to provide the majority of the thickness necessary to prevent reaction of the silicon with the crucible, and contamination of the silicon from contaminants within it.

Besides the silica, the intermediate layer can comprise any material which, after firing, will be stable and will not react with silicon. Alumina or silico-aluminate materials are particularly suitable. Carbonaceous materials that will pyrolyse during firing can also be used for certain applications.

The intermediate layer can comprise a non-organic (such as colloidal silica) and/or organic (such as an organic resin like polyethylene glycol, polyvinyl alcohol, polycarbonate, epoxy, carboxymethylcellulose) binder. The amount of the organic and non organic binder incorporated into the composition depends upon the application requirements (strength of the unfired coating, etc.). Typically, the coating comprises from 5 to 20 wt. % of non-organic binder and up to 5 wt. % of organic binder. Usually, the intermediate layer is applied in water or in solvent by spraying or brushing, preferably by spraying in a water based system comprising an appropriate amount of water to permit the suspension of the whole composition.

According to a particular embodiment of the invention, the crucible comprises a further layer (a second intermediate layer) on the top of the intermediate layer. This further layer comprises up to 50% by weight of silicon nitride, the remainder consisting essentially of silicon dioxide. This further layer improves the compatibility between the surface layer and the first intermediate layer and strongly improves its adhesion. When present, this further layer will have a thickness of up to 200 μm, preferably of 50 to 100 μm.

Depending upon the application, the surface layer will have a thickness of 50 μm to 500 μm, preferably of 200 to 500 μm. To avoid any contamination, it is essential that the surface layer be of very high purity with a ultra-low carbon content. Typically, the surface layer will comprise 50 to 100 wt. % of $Si_3N_4$, up to 50 wt. % of $SiO_2$ and up to 20 wt. % of silicon. Usually, the surface layer will be applied by spraying, brushing or any other technology known for high purity thin layer deposition, preferably by spraying. In a preferred embodiment of the process according to the invention, the step of applying the coating is followed by a heating step at a temperature and for a duration appropriate to calcinate the organic compounds present in the coatings. It can be noted that when an intermediate layer according to the invention is used, the thickness of the surface layer can be largely reduced without impairing the properties of the coating (adhesion properties).

BRIEF DESCRIPTION OF THE SEVERAL VIEWS OF THE DRAWING(S)

DETAILED DESCRIPTION OF THE INVENTION

Figure 1:
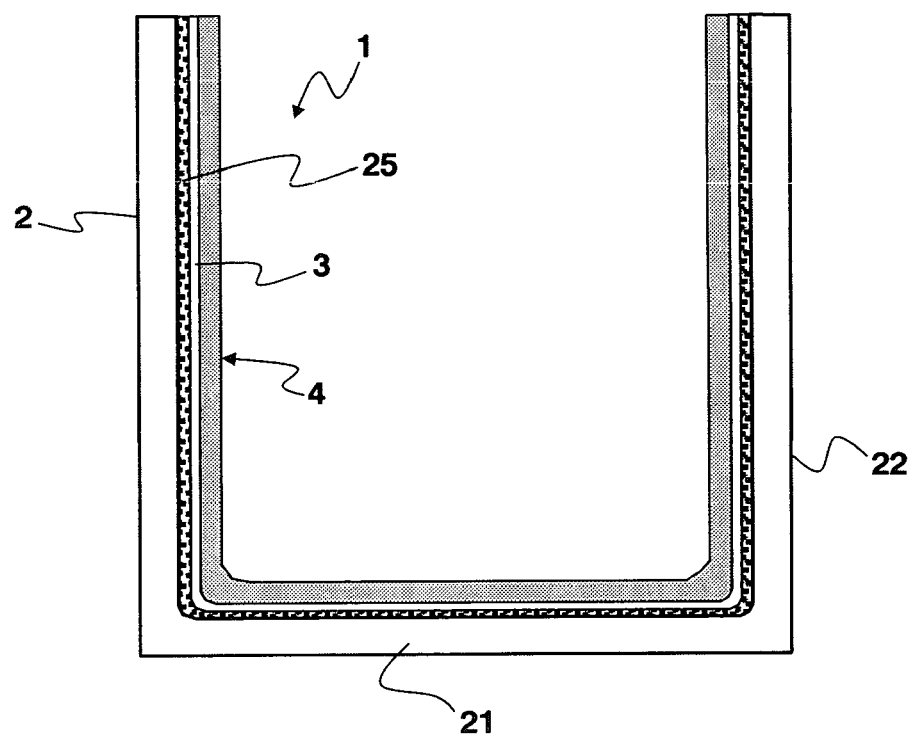
FIG. 1 is a cross-section of a crucible according to the invention.

The invention will now be described with reference to the enclosed figures which only serve to illustrate the invention and are not intended to limit its scope. Both FIGS. 1 and 2 show cross-sections of crucibles according to the invention.

On these figures, the crucible is designated with reference number 1. It comprises a base body 2 comprising a bottom surface 21 and side walls 22 which define an inner volume for the crystallization of silicon. The crucible comprises a substrate layer 25 at the surface of the side walls 22 facing the inner volume comprising 80 to 100 wt. % of silicon nitride. The crucible also comprises an intermediate layer 3 which is comprised of up to 100 wt. % of silica on the top of the substrate layer 25.

Figure 2:
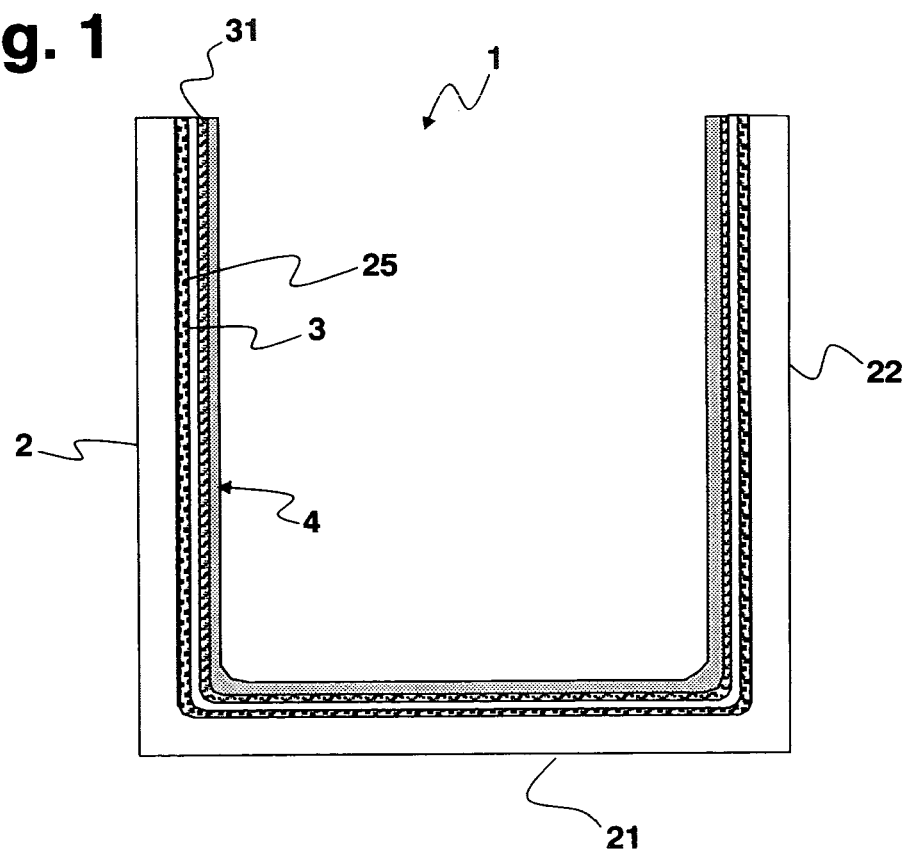
FIG. 2 is a cross section of a crucible according to the invention.

On FIG. 2, the crucible comprises a further intermediate layer 31 comprising up to 50 wt. % of $Si_3N_4$, the remainder consisting essentially of $SiO_2$. Such a further intermediate coating is not present on FIG. 1. On both figures, the crucible 1 further comprises a surface layer 4 comprising $Si_3N_4$.

The invention will now be illustrated by way of examples according to the invention and comparative examples. In the following tables, the adhesion of the various coatings has been determined in accordance with ASTM D4541 using a POSITEST PULL-OFF ADHESION TESTER (from the firm DEFELSKO Corp.). This tester evaluates the adhesion of the coating by determining the greatest tensile pull off force that it can bear before detaching, i.e., the force required to pull a specified test diameter of coating away from its substrate using hydraulic pressure. The force is expressed in term of pressure (kPa).

Examples of Substrate Layers:

TABLE I

| Substrate layer | | | | |
|---|---|---|---|---|
| | TA | TB | TC | TD |
| Colloidal silica** | | | | 5 |
| Silica grains (10-20 μm)** | | | 5 | |
| Deionized water** | +55 | | | |
| Deionized water + Binder** (PVA 5 wt. %) | | +70 | +65 | |
| Silicon nitride powder** | 100 | 100 | 80 | 85 |
| Si** | | | 15 | 10 |
| Thickness of the layer (μm) | 100 | 200 | 200 | 300 |
| Roughness (μm) | 5 | 5 | ≈5 | 5 |

**(wt. %)
Preferred compositions are TA and TB, the most preferred composition being TB.

Examples of Intermediate Layers:

TABLE II

| | Intermediate layer | | | | | | |
|---|---|---|---|---|---|---|---|
| | A | B | C | D | E | F | G |
| Colloidal silica** | | | | 25 | 30 | 30 | 15 |
| Fume silica (≈1 μm)** | | 20 | 20 | 10 | | 10 | 20 |
| Silica grains (10-20 μm)** | 100 | 40 | 40 | | 6 | 10 | 65 |
| Silica grains (20-44 μm)** | | | 20 | 65 | 60 | 60 | |
| Silica grains (45-100 μm)** | | 40 | 20 | | 4 | | |
| Deionized water** | | +50 | | +50 | | | |
| Deionized water + Binder** (PVA 10 wt. %)) | +70 | | +66 | | +50 | +45 | +60 |
| Thickness of the layer (μm) | 300 | 500 | 500 | 150 | 500 | 250 | 200 |
| Roughness (μm) | 5 | 8 | 12 | ≈5 | ≈15 | ≈10 | 5 |
| Adhesion (kPa) | 1103 | 345 | 827 | 827 | 1241 | 1379 | 1103 |

**(wt. %)

The preferred examples are those of compositions C and G, G being the most preferred.

Examples of Further Intermediate Layer:

TABLE III

| | Further intermediate layer | | |
|---|---|---|---|
| | IA | IB | IC |
| Fume silica (≈1 μm)** | | | 20 |
| Silica grains (10-20 μm)** | | 60 | 40 |
| Silica grains (20-44 μm)** | 60 | | |
| Deionized water** | +60 | | |
| Deionized water + Binder** (PVA 10 wt. %)) | | +70 | +80 |
| Silicon nitride powder** | 40 | 40 | 40 |
| Thickness of the layer (μm) | 50 | 75 | 100 |
| Roughness (μm) | 10 | 8 | 5 |

**(wt. %)

The preferred composition is the one of example IB.

Examples of Surface Layer:

TABLE IV

| | Surface layer | | | |
|---|---|---|---|---|
| | SA | SB | SC | SD |
| Colloidal silica** | | | | 5 |
| Silica grains (10-20 μm)** | | | 5 | |
| Deionized water** | +55 | | | |
| Deionized water + Binder** (PVA 10 wt. %) | | +70 | +65 | |
| Silicon nitride powder** | 100 | 100 | 80 | 85 |
| Si** | | | 15 | 10 |
| Thickness of the layer (μm) | 100 | 200 | 200 | 300 |
| Roughness (μm) | 5 | 5 | ≈5 | 5 |
| Adhesion*** (kPa) | 241 | 827 | 965 | 827 |

**(wt. %)
***with a substrate corresponding to intermediate layer G
Preferred compositions are SA and SB, the most preferred composition being SB.

Examples of Crucible:

TABLE V

| | Crucible | | | | | |
|---|---|---|---|---|---|---|
| | 1 | 2 | 3 | 4* | 5* | 6* |
| Substrate layer | TA | TB | TB | — | — | — |
| Intermediate layer | A | B | C | D | — | — |
| Further intermediate layer | IA | — | IC | — | — | — |
| Surface coating | SA | SB | SC | SD | SB | SD |
| Adhesion of the surface coating | Good | Excellent | Excellent | Good | Poor | Poor |
| Presence of cracks in the ingot | No | No | No | Some | Yes | Yes |

*Comparative example.

It is to be noted that the thickness of the surface layers SB and SD was doubled in examples 5 and 6.

The invention claimed is:

1. Crucible for the crystallization of silicon comprising
   a) a base body comprising a bottom surface and side walls defining an inner volume;
   b) a substrate layer comprising 80 to 100 wt. % of silicon nitride at the surface of the side walls facing the inner volume;
   c) an intermediate layer comprising 50 to 100 wt. % of silica on the top of the substrate layer; and
   d) a surface layer comprising 50 to 100 wt. % of silicon nitride, up to 50 wt. % of silicon dioxide and up to 20 wt. % of silicon on the top of the intermediate layer.

2. Crucible according to claim 1, wherein the substrate layer has a thickness comprised between 20 and 300 μm.

3. Crucible according to claim 1, wherein the intermediate layer has a thickness comprised between 50 and 500 μm.

4. Crucible according to claim 1, wherein the crucible comprises a further intermediate layer on the top of the first intermediate layer comprising up to 50 wt. % of silicon nitride, the remainder being silicon dioxide.

5. Crucible according to claim 4, wherein the further intermediate layer has a thickness of up to 200 μm.

6. Crucible according to claim 1, wherein the surface layer has a thickness comprised between 50 μm to 500 μm.

7. Crucible according to claim 1, wherein the surface layer comprises 50 to 100 wt. % of $Si_3N_4$, up to 40 wt. % of $SiO_2$ and up to 10 wt. % of silicon.

8. Process for the preparation of a crucible for the crystallization of silicon comprising the steps of
   a) providing a base body comprising a bottom surface and side walls defining an inner volume;
   b) applying a substrate layer comprising 80 to 100 wt. % of silicon nitride at the surface of the side walls facing the inner volume;
   c) applying an intermediate layer comprising 50 to 100 wt. % of silica on the top of the substrate layer; and
   d) applying a surface layer comprising 50 to 100 wt. % silicon nitride, up to 50 wt. % of silicon dioxide and up to 20 wt. % of silicon on the top of the intermediate layer(s).

9. Process according to claim 8, wherein it comprises a further step of
   c') applying a further intermediate layer comprising up to 50 wt. % of silicon nitride, the remainder being silicon dioxide on the top of the intermediate layer after step c).

10. Process according to claim 8, wherein at least one of the steps b), c), c') or d) is carried out by spraying.

11. Process according to claim 8, wherein it further comprises a step of heating the coated crucible at a temperature and for a duration appropriate to calcinate the organic compounds present in the coating(s).

* * * * *